United States Patent [19]

EerNisse

[11] Patent Number: 4,531,073
[45] Date of Patent: Jul. 23, 1985

[54] PIEZOELECTRIC CRYSTAL RESONATOR WITH REDUCED IMPEDANCE AND SENSITIVITY TO CHANGE IN HUMIDITY

[75] Inventor: Errol P. EerNisse, Sandy, Utah

[73] Assignee: Ohaus Scale Corporation, Florham Park, N.J.

[21] Appl. No.: 499,772

[22] Filed: May 31, 1983

[51] Int. Cl.³ .................. H01L 41/08; G01L 1/10
[52] U.S. Cl. .................. 310/370; 73/517 AV; 310/341
[58] Field of Search .......... 310/370, 366, 341, 370; 357/26; 331/40, 48, 65; 73/517 AV, 862.59, DIG. 1, DIG. 4

[56] References Cited

U.S. PATENT DOCUMENTS

| | | | |
|---|---|---|---|
| 2,289,954 | 7/1942 | Arndt, Jr. | 310/319 |
| 2,385,896 | 10/1945 | Von Beckerath | 310/365 |
| 3,128,397 | 4/1964 | Shinada et al. | 310/361 |
| 3,131,320 | 4/1964 | Shinada et al. | 310/352 |
| 3,238,789 | 3/1966 | Erdley | 73/517 |
| 3,470,400 | 9/1969 | Weisbord | 310/15 |
| 3,479,536 | 11/1969 | Norris | 310/323 |
| 3,488,530 | 4/1970 | Staudte | 310/9.1 |
| 3,513,356 | 5/1970 | Newell | 317/101 |

(List continued on next page.)

FOREIGN PATENT DOCUMENTS

| | | |
|---|---|---|
| 0050307 | 4/1982 | European Pat. Off. |
| 862778 | 11/1952 | Fed. Rep. of Germany |
| 2013631 | 7/1969 | France |
| 2178269 | 11/1973 | France |
| 52-16991 | 2/1977 | Japan |
| 54-3488 | 1/1979 | Japan |
| 54-148392 | 11/1979 | Japan |
| 556621 | 11/1974 | Switzerland |
| 1364203 | 8/1974 | United Kingdom |
| 1379670 | 1/1975 | United Kingdom |
| 2006520 | 5/1979 | United Kingdom |
| 1555171 | 11/1979 | United Kingdom |
| 1570834 | 7/1980 | United Kingdom |
| 1571965 | 7/1980 | United Kingdom |
| 2049188 | 12/1980 | United Kingdom |
| 2063559 | 6/1981 | United Kingdom |
| 2065965 | 7/1981 | United Kingdom |
| 1594980 | 8/1981 | United Kingdom |
| 1600706 | 10/1981 | United Kingdom |
| 2100504 | 12/1982 | United Kingdom |
| 587603 | 1/1978 | U.S.S.R. |
| 595845 | 2/1978 | U.S.S.R. |

OTHER PUBLICATIONS

Chuang, "Quartz Tuning Fork Using Overtone Flexure Modes", *Proc. 35th Ann. Freq. Control Symposium*, USAERADCOM, Ft. Monmouth, NJ, May 1981, pp. 130–143.

Nakazawa et al., "Frequency-Temperature Characteristics of Quartz Crystal Flexure Bars and Quartz Crystal Tuning Forks", *IEEE Transactions on Sonics and Ultrasonics*, vol. SU-26, No. 5, Sep. 1969, pp. 369–376.

Tomikawa et al., "Finite Element Analysis of Displacement at Base Portion of a Quartz Crystal Tuning Fork", *IEEE Transactions on Sonics and Ultrasonics*, vol. SU-26, No. 3, May 1979, pp. 259–261.

Kusters et al., "Analytical and Experimental Investigations of 32 KHz Quartz Tuning Forks", *Proc. 30th Ann. Frequency Control Symposium*, 1976, pp. 175–183.

Tomikawa et al., "Second-Mode Tuning Forks for High Frequencies: Finite Element Analysis and Experiments", *IEEE Transactions on Sonics and Ultrasonics*, vol. SU-27, No. 5, Sep. 1980, pp. 253–257.

(List continued on next page.)

*Primary Examiner*—Peter S. Wong
*Assistant Examiner*—D. L. Rebsch
*Attorney, Agent, or Firm*—Eugene S. Indyk

[57] ABSTRACT

An apparatus and method for exciting a piezoelectric crystal resonator has an electric oscillator connected to a double ended tuning fork piezoelectric crystal so that it flexurally vibrates in air at its mechanical resonant frequency. A novel electrode pattern connects the oscillator to the crystal such that changes in humidity do not affect the resonant frequency of the crystal. This arrangement is useful in measuring force, such as weight.

24 Claims, 3 Drawing Figures

U.S PATENT DOCUMENTS

| Number | Date | Inventor | Class |
|---|---|---|---|
| 3,601,639 | 8/1971 | Hannon et al. | 310/360 |
| 3,614,677 | 10/1971 | Wilfinger | 357/26 |
| 3,659,230 | 4/1972 | Tanaka et al. | 333/71 |
| 3,672,220 | 6/1972 | Agar | 73/398 |
| 3,683,213 | 8/1972 | Staudte | 310/9.6 |
| 3,697,766 | 10/1972 | Ganter et al. | 310/348 |
| 3,906,260 | 9/1975 | Oguchi | 310/346 |
| 3,909,641 | 9/1975 | Ohshima et al. | 310/366 |
| 3,946,257 | 3/1976 | Kawamura | 310/370 |
| 3,969,641 | 7/1976 | Oguchi et al. | 310/348 |
| 4,099,078 | 7/1978 | Shibata et al. | 310/361 |
| 4,172,908 | 10/1979 | Shibata et al. | 427/100 |
| 4,176,030 | 11/1979 | Negita | 204/192 R |
| 4,178,527 | 12/1979 | Kawashima | 310/370 |
| 4,205,248 | 5/1980 | Negita | 310/370 |
| 4,215,570 | 8/1980 | EerNisse | 310/338 |
| 4,321,500 | 3/1982 | Paros et al. | 310/321 |
| 4,356,425 | 10/1982 | Kogure et al. | 310/370 |
| 4,372,173 | 2/1983 | EerNisse et al. | 73/862.59 |
| 4,415,827 | 11/1983 | Chuang | 310/370 |
| 4,469,979 | 9/1984 | Chuang | 310/370 |

OTHER PUBLICATIONS

Tomikawa et al., "A Quartz Crystal Tuning Fork with Modified Basewidth for a High Quality Factor: Finite Element Analysis and Experiments", *IEEE Transactions on Sonics and Ultrasonics*, vol. SU-29, No. 6, Jul. 1982, pp. 217–223.

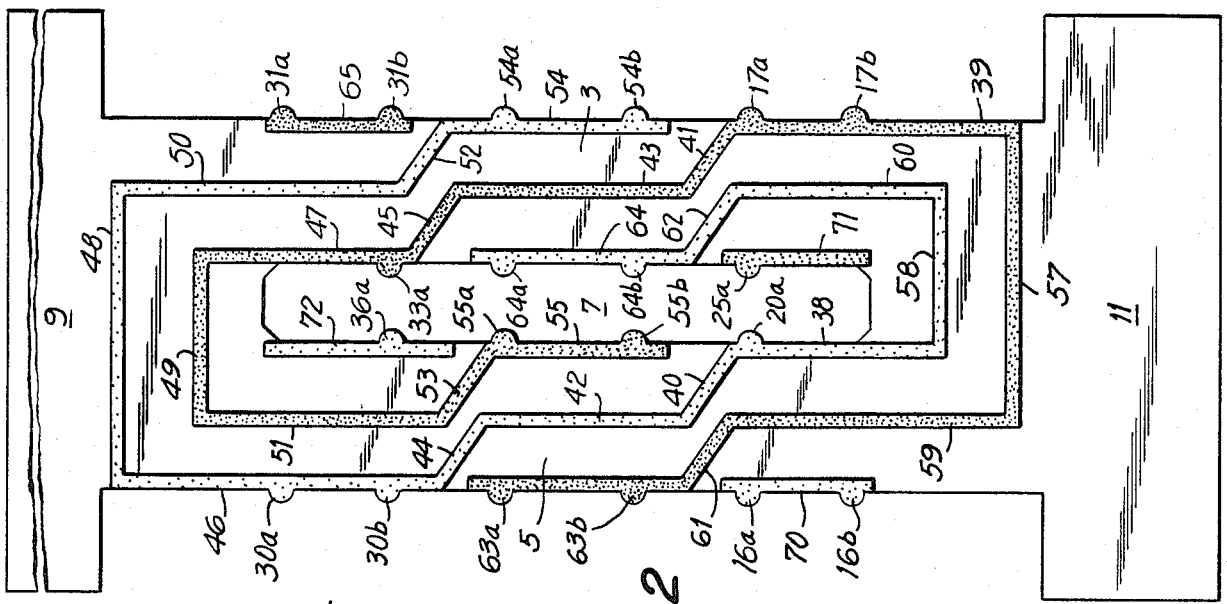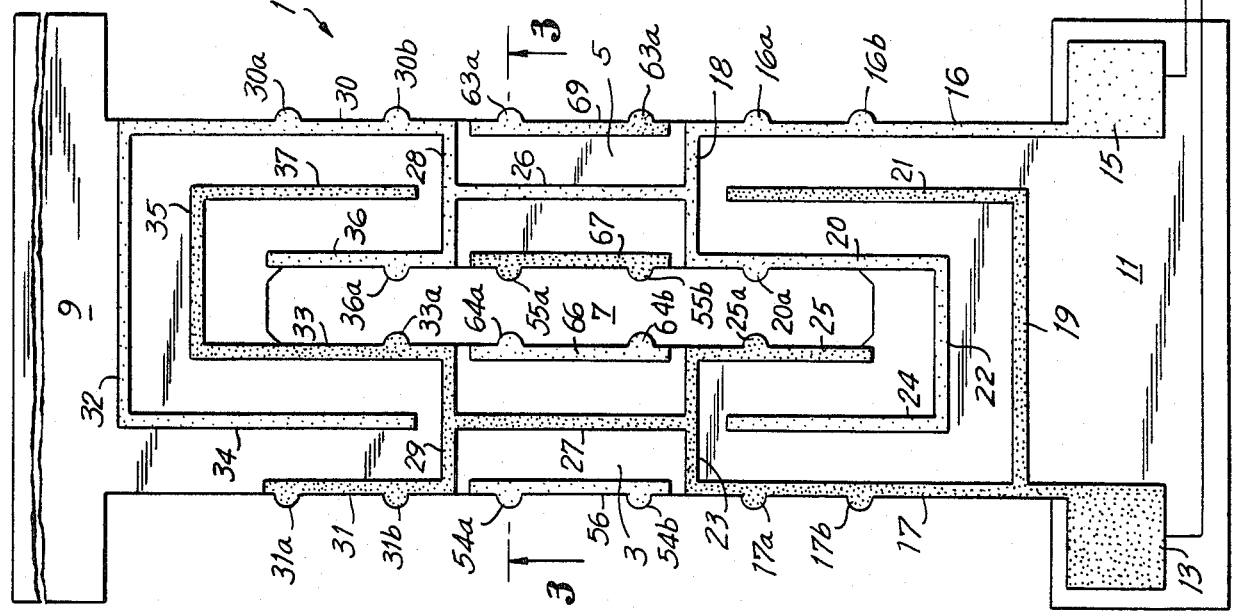

PIEZOELECTRIC CRYSTAL RESONATOR WITH REDUCED IMPEDANCE AND SENSITIVITY TO CHANGE IN HUMIDITY

BACKGROUND OF THE INVENTION

This invention relates to piezoelectric crystal resonators. More particularly, the invention relates to electrode patterns for piezoelectric crystal resonators operating in air.

Prior to this invention, there have been proposals for piezoelectric crystal resonators useful in various measurement tasks. They utilized a sample of piezoelectric material, having one or two vibrating beams. Thin coatings of conductive material were deposited in various configurations on the surfaces of the sample. The coatings formed an electrode pattern connected to an electrical oscillator circuit which excited the piezoelectric crystal to vibrate at its resonant frequency.

It also is known that the resonant frequency of the crystal changes when the crystal is subject to various stimuli. For example, if the crystal experiences an external force tending to deform the crystal, its resonant frequency changes and, consequently, the output frequency of an electrical oscillator connected to the crystal changes. This change in oscillator frequency can be sensed by conventional frequency discrimination circuitry to obtain an indication of the applied force.

Single beam quartz crystal flexure mode resonators are disclosed in U.S. Pat. No. 3,470,400 to Weisbord and U.S. Pat. No. 3,479,536 to Norris. Double beam flexure mode vibrators are disclosed in U.S. Pat. No. 3,238,789 to Erdley and U.S. Pat. No. 4,215,570 to EerNisse. All of the devices disclosed in these patents exhibit a high impedance at resonance. Moreover, the electrode patterns employed with the double beam devices do not effectively apply a lateral electric field along the entire length of the piezoelectric crystal beams. For example, the EerNisse patent discloses an electrode pattern which applies an electric field to only 44% of the beam length. These force transducers are used in a vacuum or sealed chamber filled with helium or other relatively inert gas. In some applications, however, it would be desirable to operate the resonator in air to reduce the cost of the instrument. It has been found, however, that the resonant frequency of these prior crystals is sensitive to humidity, which yields erroneous measurements in air.

Accordingly, a novel electrode pattern has been devised which lowers the crystal's impedance at resonance, effectively couples a lateral electric field to the crystal along its entire length and renders the resonance frequency relatively insensitive to changes in humidity.

BRIEF SUMMARY OF THE INVENTION

It is an object of the present invention to provide a novel electrode pattern for a piezoelectric crystal resonator.

It is another object of the invention to provide a novel electrode pattern for a piezoelectric crystal resonator which renders the resonant frequency insensitive to humidity changes in the environment.

It is a further object of the invention to provide a novel piezoelectric crystal force transducer which is insensitive to humidity changes.

It is still another object of the present invention to provide a method for rendering a piezoelectric crystal resonator insensitive to humidity changes.

It is another object of the invention to provide an electrode pattern for a piezoelectric crystal resonator so that the resonator exhibits a low impedance at resonance.

It is a further object of the invention to provide an electrode pattern for a double beam piezoelectric crystal resonator which effectively couples an electric field to the crystal over its entire beam length.

Accordingly, an elongated flexure mode resonator fabricated of piezoelectric material is disclosed. It is in the form of a double ended tuning fork having a top surface, side surfaces and a bottom surface. An electrode pattern is deposited on those surfaces so that the resonant frequency of the crystal is insensitive to humidity changes. The resonator can be connected to an oscillator circuit such that the output frequency of the oscillator circuit follows the resonant frequency of the crystal. Any compressive or tensile force applied to the crystal in an axial direction causes the resonant frequency to change which thereby causes the oscillator output frequency to change. This frequency change can be used to measure the force applied to the crystal.

BRIEF DESCRIPTION OF THE DRAWINGS

FIG. 1 shows a top plan view of the piezoelectric crystal resonator.

FIG. 2 shows a bottom plan view of the resonator.

SPECIFIC DESCRIPTION OF THE INVENTION

Figure 3:
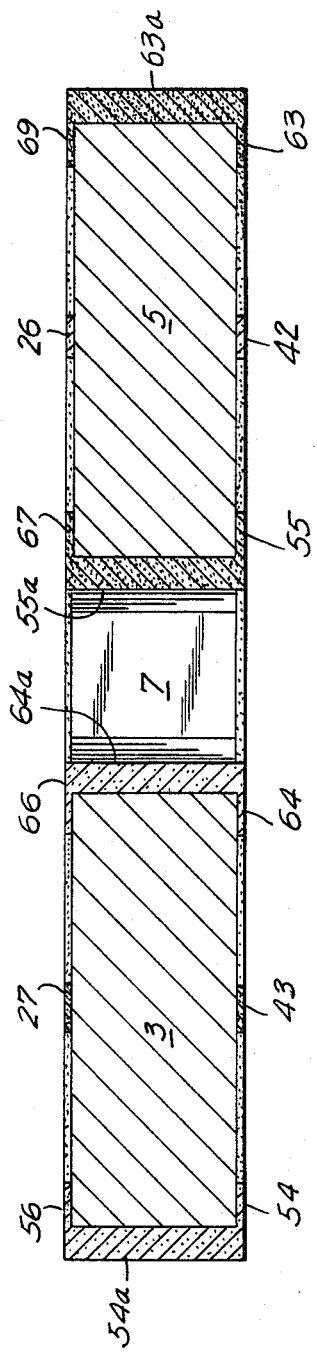
FIG. 3 shows a cross sectional view of the resonator taken along line 3—3 in FIG. 1.

FIGS. 1 and 2 depict, respectively, the top and bottom surfaces of a piezoelectric crystal resonator 1. The resonator includes elongated beams 3 and 5 of rectangular cross section extending between two wide end portions 9 and 11. The beams 3 and 5 are substantially parallel and define a slot 7 along a portion of the resonator. This structure can be made of any suitable piezoelectric material, such as quartz.

Ends 9 and 11 can be bonded in any well-known manner to elements in a measuring system which undergo movement in response to a parameter to be measured, for example, force. A compressive or tensile force is imparted to the resonator which changes its mechanical resonant frequency. This frequency change can be sensed to indicate the magnitude of the parameter to be measured.

The piezoelectric resonator can be excited to vibrate at its mechanical resonant frequency by the application of an electric field across spaced electrodes on the surfaces of the resonator. This field is supplied by an oscillator circuit connected to the spaced electrodes. The oscillator frequency follows the mechanical resonant frequency of the piezoelectric crystal and thus indicates the force imparted to the crystal.

It has been found that the resonant frequency of the crystal is dependent upon humidity when the crystal vibrates in air. This humidity dependency can be reduced by an appropriate electrode pattern. Accordingly, an electrode pattern is formed on the crystal to minimize the effects of humidity on the resonant frequency.

The electrode pattern comprises a series of conductive strips deposited on the top, side and bottom surfaces of the crystal by any well-known coating procedure, such as vacuum evaporation or sputtering.

FIG. 1 shows a pair of conductive pads 13 and 15 formed on end 11 in the same manner as the rest of the electrode pattern. The conductive pads serve as bonding sites for leads connecting the resonator with an oscillator 2. The oscillator leads can be bonded to pads 13 and 15 by any well-known technique, for example, soldering or thermal compression bonding.

FIGS. 1 and 2 show that each pad 13 and 15 is the terminus of a separate electrode deposited on the top, side and bottom surfaces of the piezoelectric crystal. Pad 13 is connected to a conductive strip 17, which is connected in series with strips 19 and 21. Strip 17 is also connected in series with strips 23 and 25. Strip 23 is connected to the upper portion of the resonator by a strip 27 joined to a laterally extending strip 29. Strip 29 is connected in series with strip 31. Strip 29 also is connected to strip 33 which in turn is connected a laterally extending strip 35 which terminates in strip 37.

Strip 17 is connected to a pair of strips 17a and 17b deposited on the side of the crystal. Strips 17a and 17b connect strip 17 with strip 39 on the bottom of the crystal. Strip 39 is connected in series with strips 41, 43, 45, 47, 49, 51 and 53 and terminates in strip 55. Strips 55a and 55b are deposited on an inner surface of slot 7 and connect strip 55 with strip 67 on the top surface of the resonator.

Strip 39 is also connected in series with strips 57, 59, 61 and 63 on the bottom surface of the crystal. Strips 63a and 63b are deposited on a side surface of the crystal and connect strip 63 with strip 69 on the top surface of the crystal. Likewise, strip 25a connects strips 25 and 71.

Pad 15 is joined to strip 16 which is connected in series with strips 18, 20, 22 and 24. Strip 18 is connected to the upper portion of the crystal by strip 26. Strip 26 is joined to strip 28 which is connected in series with strips 30, 32 and 34. Strip 28 also is connected in series to strip 36.

Strips 16a and 16b are deposited on the side surface of the crystal and connect strip 16 with strip 70 on the bottom surface of the crystal. Strip 20a is deposited on an inner surface of slot 7 and connects strip 20 to strip 38. Strip 38 is connected in series with strips 40, 42, 44, 46, 48, 50, 52 and 54. Strips 54a and 54b are deposited on a side surface of the crystal and connect strip 54 to strip 56 on the top surface of the crystal. Strip 38 is also connected in series with strips 58, 60, 62 and 64. Strips 64a and 64b are deposited on an inner surface of slot 7 and connect strip 64 with strip 66 on the top surface of the crystal. Strips 30a and 30b are deposited on a side surface of the crystal and connect strip 30 on the top surface of the crystal with strip 46 on the bottom surface of the crystal. Likewise, strip 36a connects strips 36 and 72, which completes the electrode pattern formed on the resonator.

FIG. 3 shows a cross sectional view taken through the crystal, which demonstrates more clearly how the conductive strips (for example, strips 54a, 64a, 55 a and 63a) wrap around the side surfaces of the crystal and the slot 7 to connect the portions of the electrode pattern on the top and bottom surfaces faces of the crystal. It should be pointed out that FIGS. 1 and 2 show the wrap around portions of the electrode on the sides of the crystal as thin strips. While thin strips have been found suitable, it is preferable when operating in air to widen them so that a major portion of a strip on the top surface is directly connected to a corresponding portion of a strip on the bottom surface. For example, strip 16 can be connected to strip 70 by a single wrap around strip which extends over the side surface of the crystal from point 16a to 16b. It has been found that the resonant frequency of the crystal is more insensitive to humidity as more of the side surfaces are covered by the wrap around strips.

It is apparent to persons skilled in the art that what has been described is a piezoelectric crystal resonator in the form of a double ended tuning fork excited to vibrate at its resonant frequency in a flexure mode by electrodes deposited on the top, bottom and side surfaces of the crystal. It has been found that the disclosed electrode pattern renders the crystal's resonant frequency relatively insensitive to humidity. In fact, it has been found that humidity sensitivity is reduced by as much as an order of magnitude compared with prior resonators. It is not certain why such insensitivity results, but it is theorized that the electrode pattern more effectively confines the electric field between the electrodes to the interior of the crystal. Consequently, little of the electric field passes through the environment surrounding the crystal so that humidity can have little influence on the field and, thus, little influence on the interaction between the crystal and the oscillator.

It is also apparent that the electrode pattern effectively couples a lateral electric field to the crystal along the entire length of each beam on both the top and bottom surfaces. This is because the entire length of each beam has adjacent conductive strips, each adjacent strip being connected to a different conductive pad so that a laterally directed electric field is present along substantially the entire length of each beam just below both top and bottom surfaces. This results in a lower impedance at resonance and, along with the wrap-around electrodes, more effectively confines the electric field to the crystal.

Finally, it is apparent that the pattern of conductive strips on the top surface of each crystal beam is evenly symmetric with respect to a longitudinal axis on the top surface of the beam, and the pattern of conductive strips on the bottom surface of each crystal beam is oddly symmetric with respect to a longitudinal axis on the bottom surface of the beam.

I claim:

1. A piezoelectric crystal resonator operating in air comprising:
   a piezoelectric crystal having top, bottom, and side surfaces, said crystal having a mechanical resonant frequency in air;
   an excitation means for exciting said crystal to vibrate in air at its mechanical resonant frequency;
   an electrode means deposited on said top, bottom, and side surfaces connecting said excitation means and said crystal for rendering said mechanical resonant frequency insensitive to humidity changes; and
   means for applying a force to said crystal to change its mechanical resonant frequency in air.

2. The resonator of claim 1, wherein said piezoelectric crystal forms a double ended tuning fork.

3. The resonator of claim 1, wherein the piezoelectric crystal vibrates in a flexure mode when excited by said excitation means.

4. The resonator of claim 2, wherein said double ended tuning fork comprises first and second elongated beams connected at their ends to form a rectangular slot.

5. The resonator of claim 4, wherein said electrode means comprises a first conductive coating deposited on the top surface formed in a first predetermined pattern, and a second conductive coating deposited on the bottom surface formed in a second predetermined pattern, said first and second coatings being conductively connected together by a third conductive coating deposited on the side surfaces formed in a third predetermined pattern.

6. The resonator of claim 5, wherein said first, second and third predetermined patterns differ from each other.

7. Method of exciting a piezoelectric crystal resonator having top, bottom, and side surfaces to vibrate at its mechanical resonant frequency in air comprising the steps of:
connecting an excitation means to a conductive electrode pattern deposited on the top, bottom, and side surfaces of said crystal resonator which renders the mechanical resonant frequency insensitive to humidity changes; and
applying a force to said crystal resonator to change said mechanical resonant frequency.

8. The method of claim 7 wherein said connecting step includes:
coating said crystal resonator with said conductive electrode pattern.

9. Method of exciting a piezoelectric flexure mode crystal resonator in the form of a double ended tuning fork having top, bottom, and side surfaces comprising the steps of:
generating an excitation signal;
connecting said excitation signal to a conductive electrode pattern deposited on the top, bottom, and side surfaces of said crystal resonator which renders the mechanical resonance frequency of said resonator vibrating in air insensitive to humidity changes; and
applying a force to said crystal resonator to change said mechanical resonance frequency.

10. A piezoelectric crystal resonator comprising:
a first elongated beam of piezoelectric material;
a second elongated beam of piezoelectric material substantially parallel to said first beam;
said first and second beams each having a top surface, a bottom surface and side surfaces connecting said top and bottom surfaces;
said first and second beams being connected to each other by first and second end portions of piezoelectric material so as to form a slot between said first and second beams;
a first conductive pad deposited on said first end portion;
a second conductive pad deposited on said first end portion and insulated from said first conductive pad;
a first electrode pattern connected to said first conductive pad, said first electrode pattern comprising conductive strips deposited on the top and bottom surfaces of said first and second beams, said conductive strips having a substantially uniform lateral width and extending longitudinally along substantially the entire length of the top and bottom surfaces of said first and second beams;
a second electrode pattern connected to said second conductive pad, said second electrode pattern comprising conductive strips deposited on the top and bottom surfaces of said first and second beams, insulated entirely from said first electrode pattern, said conductive strips of said second electrode pattern having a substantially uniform lateral width and extending longitudinally along substantially the entire length of the top and bottom surfaces of said first and second beams;
a first wraparound electrode pattern deposited on the side surface of said first and second beams and connecting the portion of said first electrode pattern deposited on said top surfaces of said first and second beams with the portion of said first electrode pattern deposited on said bottom surfaces of said first and second beams; and
a second wraparound electrode pattern deposited on the side surfaces of said first and second beams, insulated entirely from said first wraparound electrode pattern, and connecting the portion of said second electrode pattern deposited on said top surfaces of said first and second beams with the portion of said second electrode pattern deposited on the bottom surfaces of said first and second beams; and
a means for applying a force to said beams of piezoelectric material to change the mechanical resonant frequency of said resonator.

11. The piezoelectric crystal resonator of claim 10 wherein the conductive strips deposited on the top surfaces of each beam are evenly symmetric with respect to a longitudinal axis on the top surface of the beam, and
wherein the conductive strips deposited on the bottom surfaces of each beam are oddly symmetrical with respect to a longitudinal axis on the bottom surface of the beam.

12. The piezoelectric crystal resonator of claim 10, wherein the resonator is mounted in air.

13. The piezoelectric crystal resonator of claim 11 wherein the resonator is mounted in air.

14. The piezoelectric crystal resonator of claim 12 wherein the resonant frequency of said resonator is insensitive to changes in humidity.

15. The piezoelectric crystal resonator of claim 13 wherein the resonant frequency of said resonator is insensitive to changes in humidity.

16. A piezoelectric crystal resonator comprising:
an elongated substantially rectangular piezoelectric crystal having top, bottom and side surfaces;
a first electrode pattern deposited on the top surface of said piezoelectric crystal which is evenly symmetric with respect to a longitudinal axis on the top surface of said crystal;
a second electrode pattern deposited on the bottom surface of said piezoelectric crystal which is oddly symmetric with respect to a longitudinal axis on the bottom surface of said crystal;
a wraparound electrode pattern deposited on said side surfaces connecting said first and second electrode patterns; and
a means for applying a force to said piezoelectric crystal to change the mechanical resonant frequency of said resonator.

17. The piezoelectric crystal resonator of claim 16 wherein the resonator is mounted in air.

18. The piezoelectric crystal resonator of claim 17, wherein the resonant frequency of said resonator is insensitive to changes in humidity.

19. A piezoelectric crystal resonator comprising:
an elongated beam of piezoelectric material;
said beam having a top surface, a bottom surface and side surfaces connecting said top and bottom surfaces;
said beam having a first and second end portions of piezoelectric material;
a first conductive pad deposited on said first end portion;
a second conductive pad deposited on said first end portion and insulated from said first conductive pad;
a first electrode pattern connected to said first conductive pad, said first electrode pattern comprising conductive strips deposited on the top and bottom surfaces of said beam, said conductive strips having a substantially uniform lateral width and extending longitudinally along substantially the entire length of the top and bottom surfaces of said beam;
a second electrode pattern connected to said second conductive pad, said second electrode pattern comprising conductive strips deposited on the top and bottom surfaces of said beam, insulated entirely from said first electrode pattern, said conductive strips of said second electrode pattern having a substantially uniform lateral width and extending longitudinally along substantially the entire length of the top and bottom surfaces of said beam;
a first wraparound electrode pattern deposited on the side surfaces of said beam and connecting the portion of said first electrode pattern deposited on said top surface of said beam with the portion of said first electrode pattern deposited on said bottom surface of said beam;
a second wraparound electrode pattern deposited on the side surfaces of said beam, insulated entirely from said first wraparound electrode pattern, and connecting the portion of said second electrode pattern deposited on said top surface of said beam with the portion of said second electroded pattern deposited on the bottom surface of said beam; and
a means for applying a force to said first and second end portions of piezoelectric material to change the mechanical resonant frequency of said resonator.

20. The piezoelectric crystal resonator of claim 19, wherein the conductive strips deposited on the top surface of said beam are evenly symmetric with respect to a longitudinal axis on the top surface of the beam; and
wherein the conductive strips deposited on the bottom surface of said beam are oddly symmetric with respect to a longitudinal axis on the bottom surface of the beam.

21. The piezoelectric crystal resonator of claim 19, wherein the resonator is mounted in air.

22. The piezoelectric crystal resonator of claim 20, wherein the resonator is mounted in air.

23. The piezoelectric crystal resonator of claim 21, wherein the resonant frequency of said resonator is insensitive to changes in humidity.

24. The piezoelectric crystal resonant of claim 22, wherein the resonant frequency of said resonator is insensitive to changes in humidity.

* * * * *

UNITED STATES PATENT AND TRADEMARK OFFICE
CERTIFICATE OF CORRECTION

PATENT NO.  : 4,531,073
DATED       : July 23, 1985
INVENTOR(S) : Errol P. EerNisse It is certified that error appears in the above-identified patent and that said Letters Patent is hereby corrected as shown below:

Cover page 2, column 1:   After "4,178,527 12/1979 Kawashima ... 310/370" insert --4,178,566 12/1979 Kawashima ... 331/156--.

Column 2, line 68:   Change "deposted" to --deposited--.

Column 3, line 63:   Delete "faces".

Column 8, line 8:    Change "electroded" to --electrode--.

Column 8, line 14:   Change "deposted" to --deposited--.

Signed and Sealed this

Fifteenth Day of September, 1987

Attest:

DONALD J. QUIGG

*Attesting Officer*     *Commissioner of Patents and Trademarks*